(12) United States Patent
Van Noort et al.

(10) Patent No.: US 8,084,829 B2
(45) Date of Patent: Dec. 27, 2011

(54) SEMICONDUCTORS DEVICE AND METHOD OF MANUFACTURING SUCH A DEVICE

(75) Inventors: Wibo D. Van Noort, Wappingers Falls, NY (US); Petrus H. C. Magnee, Malden (NL); Lis K. Nanver, Zoetermeer (NL); Celine J. Detcheverry, Eindhoven (NL); Ramon J. Havens, Eindhoven (NL)

(73) Assignee: NXP B.V., Eindhoven (NL)

( * ) Notice: Subject to any disclaimer, the term of this patent is extended or adjusted under 35 U.S.C. 154(b) by 1042 days.

(21) Appl. No.: 11/578,902

(22) PCT Filed: Apr. 20, 2005

(86) PCT No.: PCT/IB2005/051293
§ 371 (c)(1),
(2), (4) Date: Dec. 18, 2007

(87) PCT Pub. No.: WO2005/104232
PCT Pub. Date: Nov. 3, 2005

(65) Prior Publication Data
US 2008/0173974 A1     Jul. 24, 2008

(30) Foreign Application Priority Data

Apr. 27, 2004  (EP) .................................. 04101769
Jun. 23, 2004  (EP) .................................. 04102908
Jul. 30, 2004  (EP) .................................. 04103676

(51) Int. Cl.
    H01L 27/11    (2006.01)
(52) U.S. Cl. ........ 257/379; 438/147; 257/539; 257/516; 257/528; 257/543
(58) Field of Classification Search .................. 438/147; 257/379, 516, 528–543
    See application file for complete search history.

(56) References Cited

U.S. PATENT DOCUMENTS

| 6,346,444 B1 * | 2/2002 | Park et al. ..................... 438/268 |
| 6,503,838 B1 | 1/2003 | Swanson |
| 2002/0093075 A1 | 7/2002 | Gates |
| 2002/0096684 A1 * | 7/2002 | Brandes et al. .................. 257/77 |
| 2003/0006415 A1 * | 1/2003 | Yokogawa et al. ............. 257/77 |

FOREIGN PATENT DOCUMENTS

| EP | 1 450 394 | 8/2004 |
| JP | 08 316420 | 3/1997 |
| WO | WO 02/49110 | 6/2002 |
| WO | WO 2004/008512 | 1/2004 |

* cited by examiner

*Primary Examiner* — N Drew Richards
*Assistant Examiner* — Jae Lee

(57) ABSTRACT

The invention relates to a semiconductor device (10) comprising a semiconductor body (1) with a high-ohmic semiconductor substrate (2) which is covered with a dielectric layer (3, 4) containing charges, on which dielectric layer one or more passive electronic components (20) comprising conductor tracks (20) are provided, wherein, at the location of the passive elements (20), a region (5) is present at the interface between the semiconductor substrate (2) and the dielectric layer (3, 4), as a result of which the conductivity of an electrically conducting channel induced in the device (10) by the charges is limited at the location of the region (5). According to the invention, the region (5) is formed by deposition and comprises a semi-insulating material. As a result, the device (10) has a very low high-frequency power loss because the inversion channel is formed in the semi-insulating region (5). The device (10) further allows for a higher temperature budget and hence for the integration of active semiconductor elements (8) into the semiconductor body (1). A very suitable semi-insulating material for the region (5) is SiC, SIPOS or POLYDOX.

16 Claims, 13 Drawing Sheets

SEMICONDUCTORS DEVICE AND METHOD OF MANUFACTURING SUCH A DEVICE

The invention relates to a semiconductor device comprising a semiconductor body with a high-ohmic semiconductor substrate which is covered with a dielectric layer which contains charges, on which dielectric layer one or more passive electronic elements, including conductor tracks, are situated, wherein, at the location of the passive elements, a region is situated at the interface between the semiconductor substrate and the dielectric layer, causing the electrical conductivity of an electroconductive channel induced in the semiconductor device by the charges to be decreased at the location of the region.

In this application, "a high-ohmic semiconductor substrate" is to be taken to mean in particular a semiconductor substrate whose resistivity is larger than or equal to approximately 1 kΩcm and, in practice, ranges between 1 and 10 kΩcm.

High-resistivity silicon (HRS) has for long been viewed as a potentially ideal substrate for the integration of radio-frequency (RF) circuits due to the very high-quality (Q) passive components that can be integrated, the excellent thermal conductivity of silicon, and the compatibility with conventional silicon processing. The high bulk resistivity of HRS, however, is typically overshadowed by a parasitic surface channel formed, leading to both increased substrate loss and excessive variation of the effective substrate resistivity across the wafer. Those surface channels build up at the silicon/silicon-dioxide interface as a result of oxide contamination, of interface states, or of an electrical bias between a conductive structure, such as a passive component, above the field oxide and the silicon.

In this application an electroconductive channel may be an inversion channel or an accumulation channel. This depends on the charge in the dielectric layer, which in practice frequently is a positive charge, so that an n-type channel is formed, and on the conductivity type of the semiconductor substrate. In the case of a p-type substrate, for example inversion occurs, while in the case of an n-type substrate, accumulation occurs. The invention also relates to a method of manufacturing such a device.

A device and a method of the type mentioned in the opening paragraph are known from Japanese patent JP-A-08-316420, published on 29 Nov. 1996. In said document a description is given of a device comprising a high-ohmic silicon substrate which is provided with a dielectric layer in the form of a silicon dioxide layer on which wiring is provided. In order to counteract high-frequency power losses caused by the development of an inversion or accumulation layer at the interface between the silicon substrate and the silicon dioxide layer, a polycrystalline or amorphous silicon region is situated at said interface, which region is formed by damaging the crystal structure of the silicon substrate by means of ion implantation. The region thus formed comprises charge traps which, at the location where they are situated, capture the charge of an inversion or accumulation channel formed, and thus limit its conductivity, or even locally interrupt the channel.

A drawback of the known device resides in that sometimes it still shows problems which correspond to a reduction of the effective resistance of the high-ohmic semiconductor substrate.

An object of the present invention therefore is to provide a device of the type mentioned in the opening paragraph, wherein the semiconductor substrate shows high-ohmic behavior in a larger number of circumstances. The invention also aims at providing a simple method of manufacturing such a device.

To achieve this, in accordance with the invention, a device of the type mentioned in the opening paragraph is characterized in that the region is formed by means of deposition and comprises a semi-insulating material.

The invention is based, first of all, on the recognition that the problem of the development of a semiconductor substrate with a lower ohmic value occurs in particular in devices in which also semiconductor elements are integrated in the semiconductor body. The associated processes sometimes require a comparatively high temperature budget, particularly at the beginning of the manufacturing process. A thermal treatment at a comparatively high temperature enables the crystallinity of the polycrystalline or amorphous region of the known device to be restored, leading to a reduction of the concentration of charge traps, as a result of which the formation of an electroconductive channel becomes possible.

The invention is further based on the recognition that deposition of the region enables a free choice of the material used for the region. By choosing a so-termed semi-insulating material as the material for the region, it can be achieved, on the one hand, that an electroconductive channel at the location of the region is formed in the semi-insulating region rather than in the semiconductor substrate. The conductivity of a thin layer of such a material is sufficient for this purpose. On the other hand, such a material may exhibit such a high resistivity or such a low mobility that the channel formed therein hardly, or not at all, leads to a reduction of the effective substrate resistance.

Finally, the invention is based on the recognition that such materials frequently have a comparatively high temperature budget. For example, the region may be a semi-insulating region of SiC or C (diamond). Such a region may be formed by patterning the semi-insulating layer which is provided in monocrystalline form on silicon, in which case the resistivity cannot be changed by recrystallization. More generally, such semi-insulating materials will be polycrystalline or amorphous, however, their behavior will be less temperature-dependent than that of polycrystalline or amorphous silicon.

In a preferred embodiment of a semiconductor device in accordance with the invention, the semi-insulating material of the deposited region comprises a mixture of silicon and oxygen. Such a material, which is known under the name "SIPOS" (=Semi-Insulating Polycrystalline Oxygen-Doped Silicon) and also under the name "POLYDOX", has, on the one hand, the desired properties and, on the other hand, can be readily formed by decomposition of, for example, silane ($SiH_4$) to which is added oxygen gas or at least a gas containing an oxygen-containing compound, for example a compound of oxygen and nitrogen.

More generally, a suitably deposited semi-insulating material has a resistivity in the range between 10 kΩcm and 30 GΩcm, and preferably in the range between 1 MΩcm and 1 GΩm. Besides the above-mentioned SIPOS/POLYDOX, also other materials are suitable for this purpose. For example, instead of oxygen, nitrogen may be added to silicon in a suitable concentration. Also mixtures/compounds of silicon, oxygen and nitrogen and/or, if necessary, other elements such as germanium or carbon may form suitable semi-insulating materials.

A preferred material for the semi-insulating layer is SiC, which material has a high sheet resistivity in the $10^{11}$ ohmcm range, good passivating properties on the high-ohmic silicon substrate and low mechanical stress.

The composition of the silicon and carbon can be adjusted in a low temperature IC compatible deposition process (e.g. PECVD) so that a low mechanical stress in a range below 360 MPa (compressive stress) is obtained for as-deposited films. The stress can be further reduced to 20 MPa and even shifted into low tensile stress by a post deposition anneal at 600° C. There were no resistivity changes after temperature treatment.

The SiC layers have excellent etch resistance to commonly used wet etchants like HF and KOH. Patterning of the SiC layers can be done in conventional dry etch equipment, using fluorine based chemistry.

It is a major advantage that this temperature stable SiC passivation layer can be provided on the high-ohmic semiconductor substrate very early in the front-end process of the manufacturing of the semiconductor device. The SiC layer can be provided prior to a dopant activation anneal step in the semiconductor device. The activation of dopants usually occurs at high temperatures above 700 degrees C., typical in a range between 900 and 1100 degrees C.

The excellent thermal stability of the SiC layer in combination with low mechanical stress and the high etch resistance makes this material very suitable as semi-insulating layer. Moreover, the SiC layer may be very thin to achieve the surface passivation. The uniformity of the layer will determine how thin it can be, e.g. isolated island formation, large pin-holes should be avoided. But there isn't an electrical isolation breakdown issue as for surface isolation layers.

In a particularly favorable embodiment, the deposited semi-insulating region is situated at the bottom of a recess formed in the semiconductor substrate. By virtue thereof, the region can be formed in a very simple manner, as will be elucidated herein below. In addition, such a recess can be readily used to form a so-termed trench isolations which may be used if semiconductor elements, such as diodes and transistors, are formed in the semiconductor body so as to be integrated therein.

In an attractive modification, the semiconductor body comprises a semiconductor region with one or more semiconductor elements integrated therein.

The semiconductor region may be formed by a suitable ion implantation, but also by deposition. The passive elements, including conductor tracks which may form e.g. a transmission line, connection conductors or a connection region, but which may also include elements such as capacitors and coils are preferably situated in a part of the device, while the integrated semiconductor elements are situated in another part of the device.

Preferably, the region comprises a number of mutually separated strip-shaped sub-regions. As a result, a substantial part of an inversion or accumulation channel formed is situated in the semi-insulating region. In addition, the longitudinal direction thereof extends preferably substantially parallel to the longitudinal direction of the passive elements, such as conductor tracks. By virtue thereof, the operation of the region with respect to the relevant conductor tracks is optimal. The currents induced in the substrate by these passive elements will then cross the strip-shaped region/strip-shaped sub-regions substantially at right angles. In addition, sub-regions may be provided which extend in two mutually perpendicular directions. If the strip-shaped regions are situated in the above-mentioned, so-termed isolation trenches, then they are preferably present in the part of the device where the passive elements are present as well as in the part of the device where the integrated semiconductor elements are present. In the latter part of the device, the strip-shaped sub-regions of the deposited semi-insulating material may act as a so-termed channel stopper.

A method of manufacturing a semiconductor device comprising a semiconductor body, wherein a dielectric layer comprising charges is formed on a high-ohmic semiconductor substrate, and one or more passive electronic elements, including conductor tracks, are provided on said dielectric layer, and wherein, at the location of the passive elements, a region is formed at the interface between the semiconductor substrate and the dielectric layer, as a result of which, during operation, the conductivity of an electroconductive channel induced in the semiconductor device by the charges is reduced at the location of the region, is characterized in accordance with the invention in that the region is formed by means of deposition, and a semi-insulating material is selected as the material for the region. Preferably, a mixture of silicon and oxygen is chosen as the semi-insulating material.

According to a preferred embodiment, in the semiconductor substrate a recess is formed a side wall of which is covered with an insulating spacer, after which a thin semi-insulating layer is deposited on the surface of the device as well as a dielectric layer by means of which the recess is filled completely, whereafter the device is planarized by means of chemical-mechanical polishing, in which process the parts of the semi-insulating layer and dielectric layer that are situated outside the recess are removed.

In a suitable modification, the insulating spacer is formed by subjecting the walls and the bottom of the recess to a thermal oxidation treatment, after which the thermal oxide formed at the bottom of the recess is removed again by means of anisotropic etching.

Preferably, a part of the semi-insulating layer bordering on the surface of the device is converted into a dielectric region by means of oxidation.

These and other aspects of the invention are apparent from and will be elucidated with reference to the embodiments described hereinafter.

In the drawings:

FIG. 1A-B is a diagrammatic, cross-sectional view at right angles to the thickness direction of a semiconductor device in accordance with the invention, and FIG. 2A shows the capacitance voltage characteristics and FIG. 2B shows the coplanar wave guide attenuation with a) no surface passivation and b) with a semi-insulating layer of SiC according to the invention.

Figure 8:
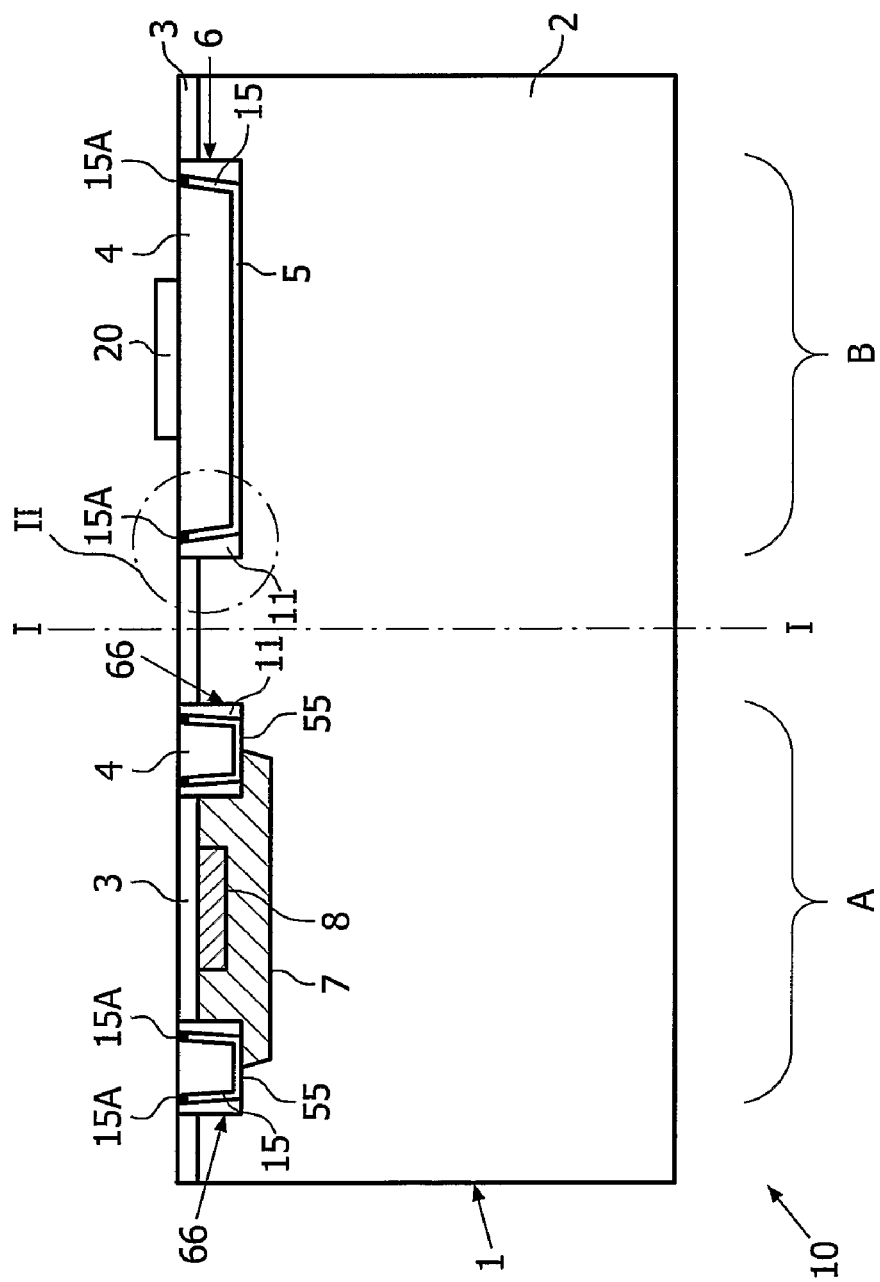
Figure 9:
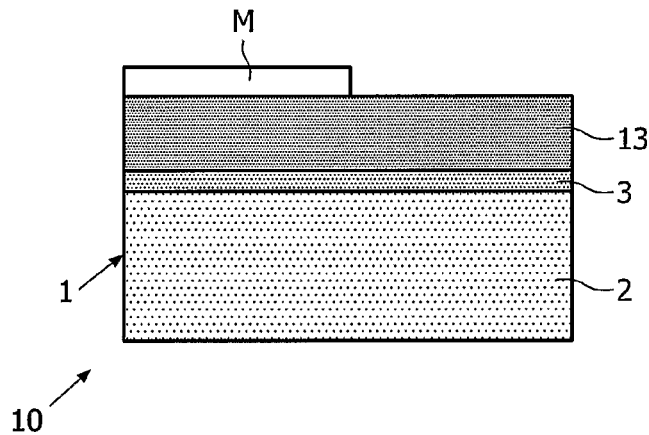
Figure 10:
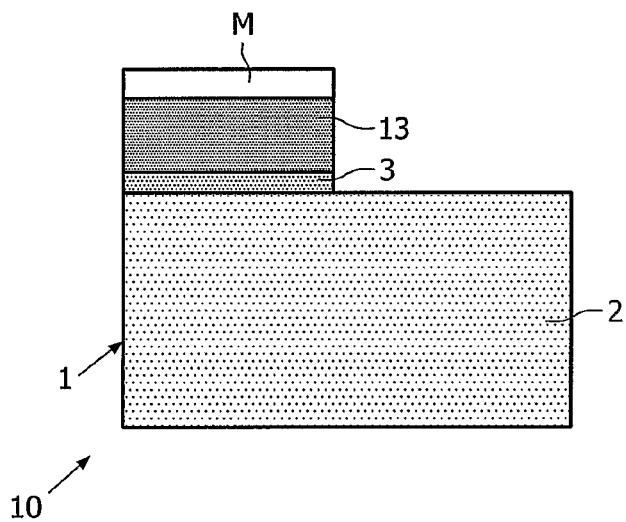

FIG. 8 is a diagrammatic, cross-sectional view at right angles to the thickness direction of a second embodiment of a semiconductor device in accordance with the invention, and FIGS. 9 through 15 are diagrammatic, cross-sectional views at right angles to the thickness direction of a part referenced II in FIG. 8, in successive stages of the manufacture using an embodiment of a method in accordance with the invention.

Figure 16:
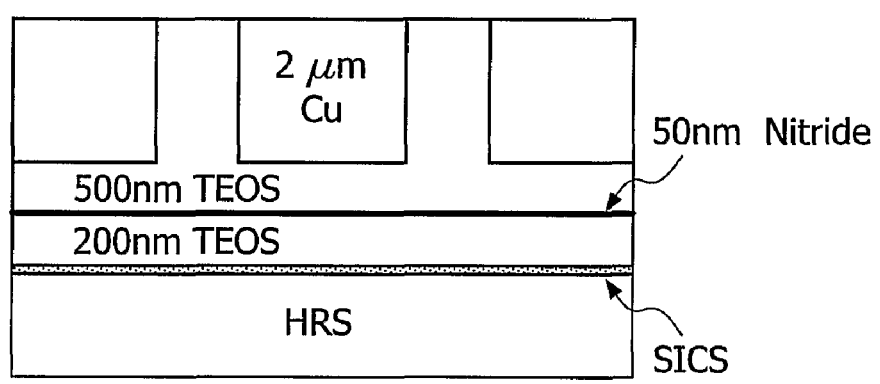

FIG. 16 is a diagrammatic, cross-sectional view of a co-planar waveguide (CPW).

Figure 17:
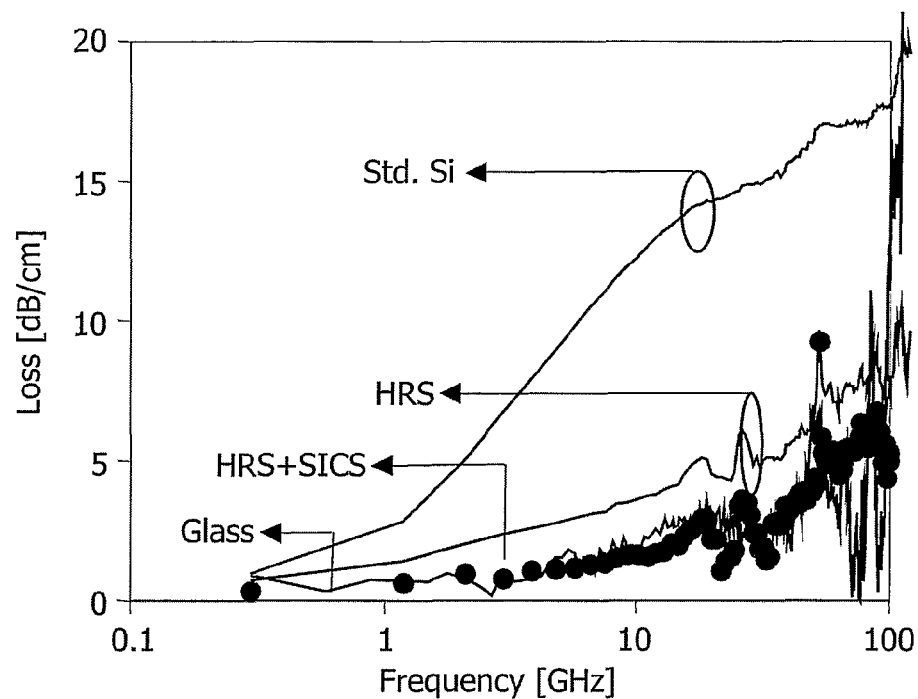

FIG. 17 shows the losses of the co-planar waveguide on three silicon substrates of different conductivity.

Figure 18:
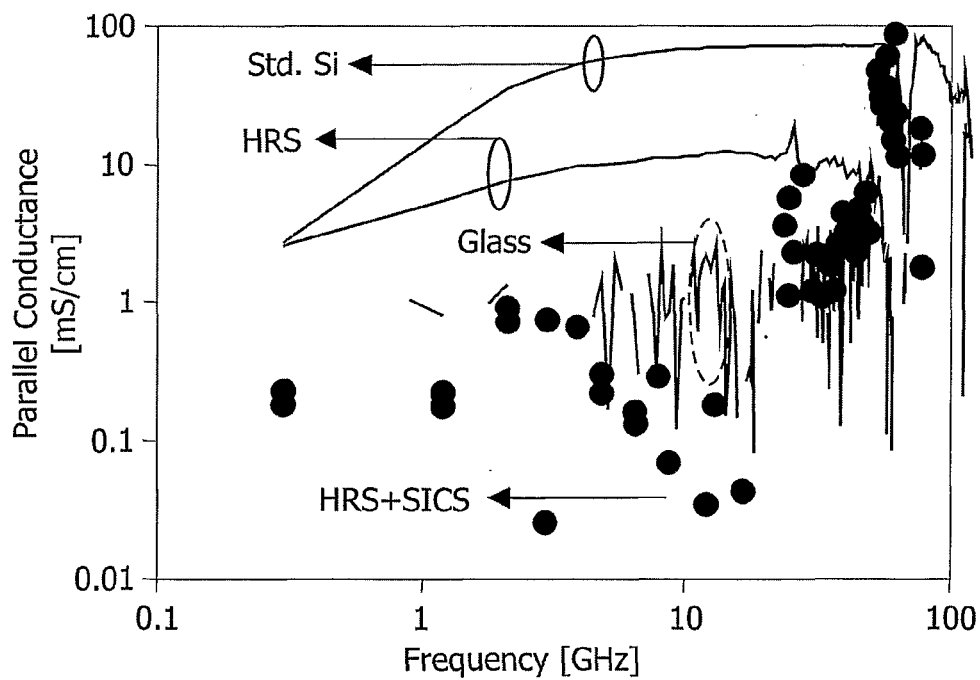

FIG. 18 shows the parallel conductance of the signal to ground through the dielectric layer and the substrate.

Figure 19:
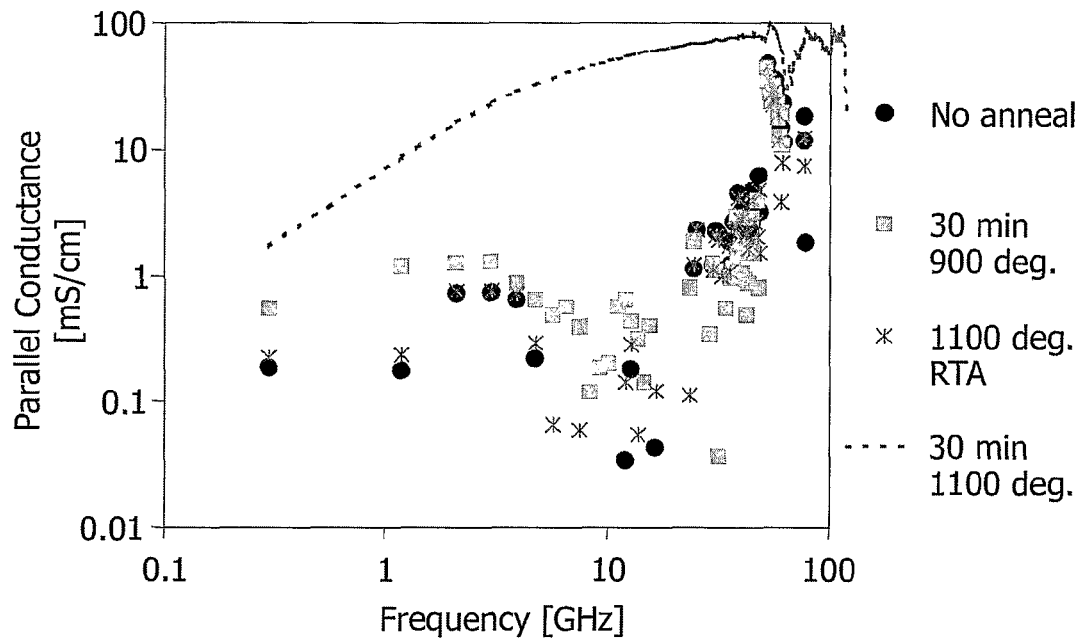

FIG. 19 shows the parallel conductance of structures with a semi-insulating channel stopper (SICS) which were subjected to a temperature step at different temperatures and for different periods of time.

Figure 20:
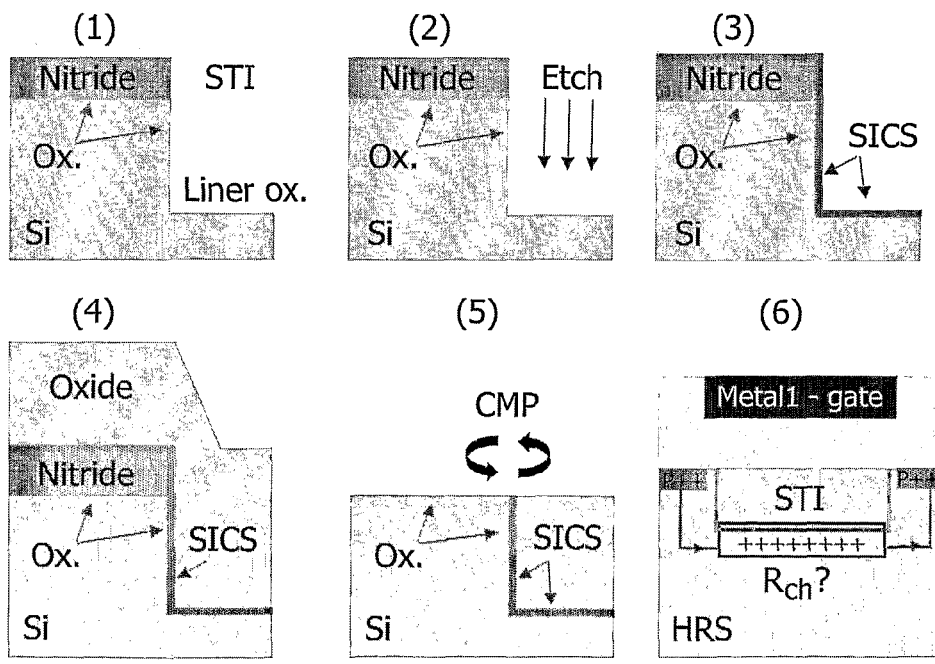

FIG. 20 shows an alternative embodiment of the invention, wherein the insulating layer at the bottom of the recess is removed by etching before the semi-insulating layer is deposited, wherein FIG. 20-(6) shows a structure which is used to measure the effect of the semi-insulating layer in the recess (STI).

Figure 21:
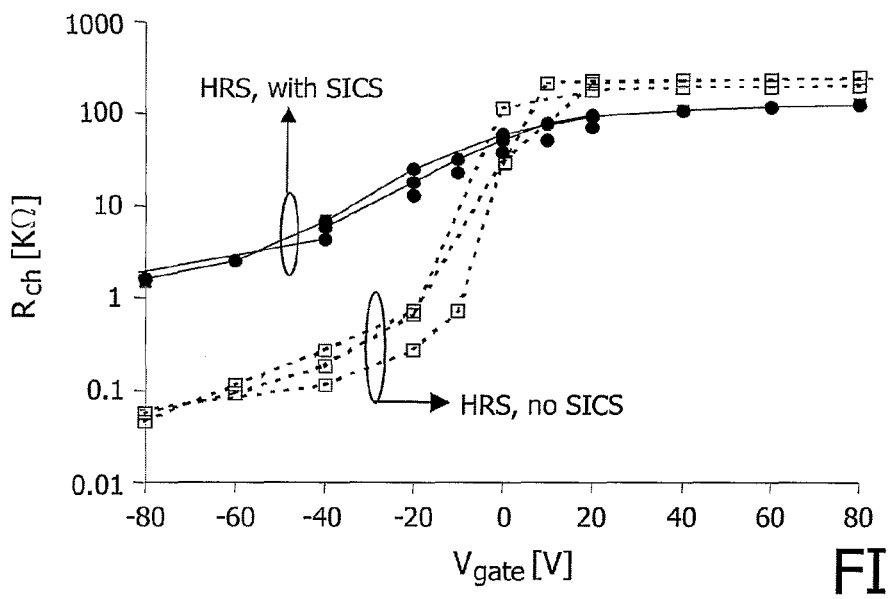

FIG. 21 shows the resistance of the inversion channel as a function of the voltage on the gate.

Figure 22:
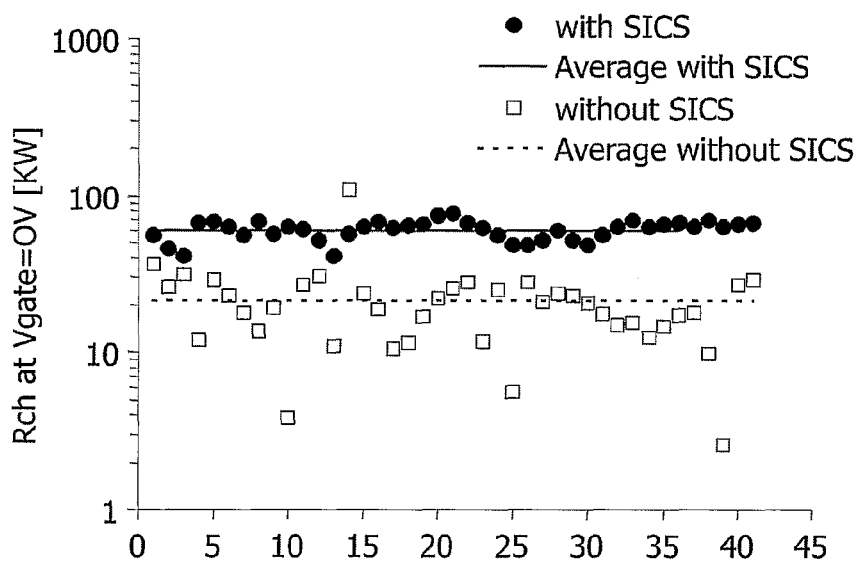

FIG. 22 shows the resistance of the inversion channel measured at a gate voltage of 0 V on different wafers with a high resistivity:
a) Si reference wafers without the invention;
b) The same Si wafers with the semi-insulating channel stopper (SICS) in accordance with the invention.

Figure 23:
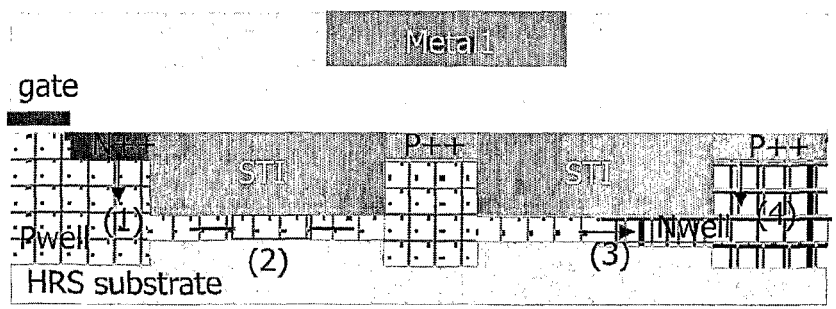

FIG. 23 diagrammatically shows a few parameters which may be influenced by the semi-insulating layer in the STI structure.

Figure 24:
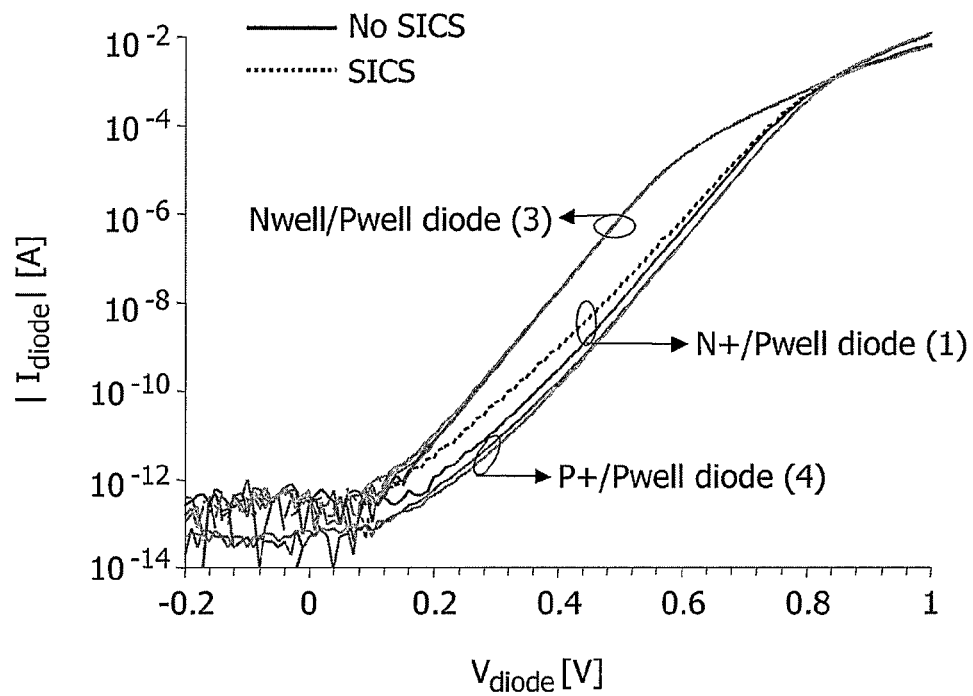

FIG. 24 shows the diode current illustrated in FIG. 23, wherein
a) reference without the invention,
b) with the semi-insulating channel stopper (SICS).

Figure 25:
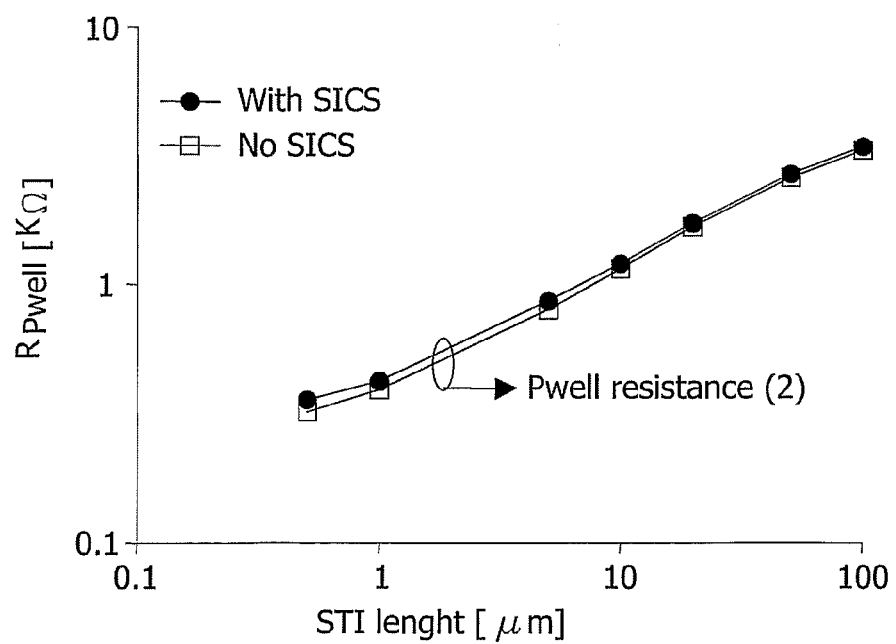

FIG. 25 shows the p-well resistance, wherein a) reference without the invention and b) with the semi-insulating layer in accordance with the invention.

The figures are not drawn to scale and some dimensions, such as dimensions in the thickness direction, are exaggerated for clarity. Corresponding regions or parts in the different Figures are indicated by means of the same hatching or reference numeral, whenever possible.

Figure 1A:
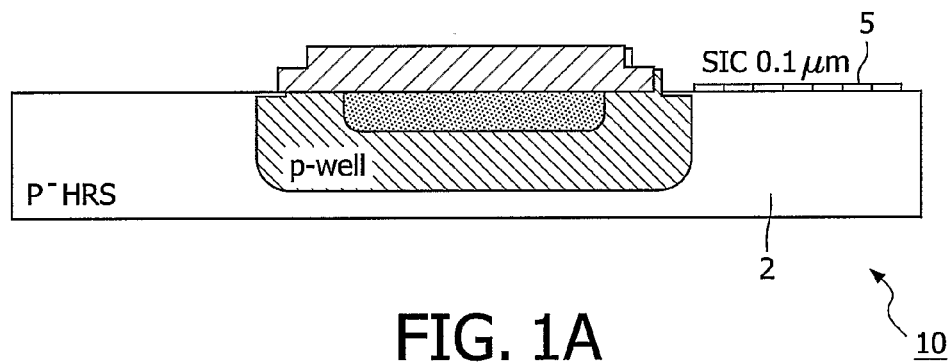
Figure 1B:
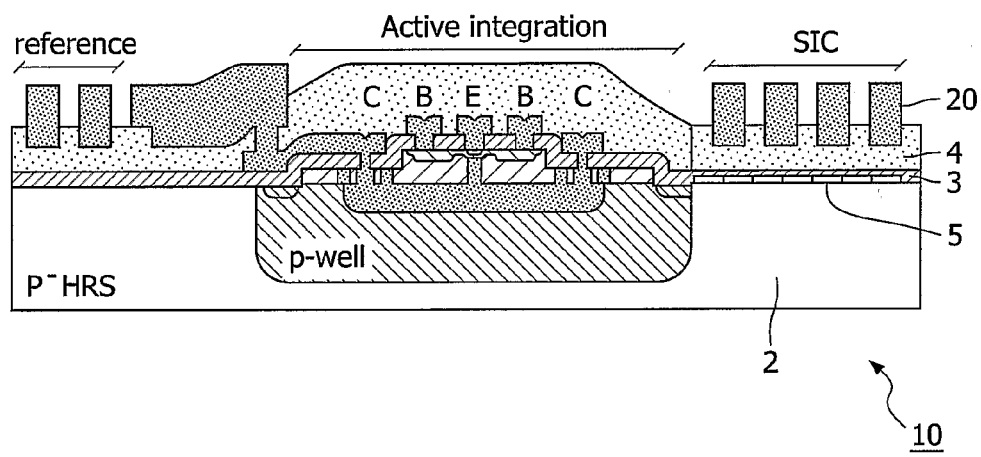

FIG. 1A-B is a diagrammatic, cross-sectional view at right angles to the thickness direction of a semiconductor device in accordance with the invention. A semiconductor device 10 comprises a semiconductor body 1 with a p-type semiconductor substrate 2 of silicon having a resistivity in this embodiment of 2-4 kΩcm.

A 100-nm low-stress PECVD SiC film is provided on the p-type high resistivity substrate (HRS). The SiC film provides HRS surface passivation prior to the device integration process flow, i.e. as an equivalent to a starting wafer in a standard silicon process.

A Novellus Concept One PECVD system is used for the deposition of the amorphous SiC films. The main deposition parameters used for the SiC deposition are: temperature 400° C., pressure 2.25 torr, gas flow 100 sccm $SiH_4$ and 3000 sccm $CH_4$, and power 1000 W (HF=500 W; LF=500 W). The deposition rate of SiC using the deposition parameters mentioned above is 670 Å $min^{-1}$ with an uniformity of about 1%. A refractive index of 2.4 has been measured for these films.

The sheet resistivity of the SiC film is in the $10^{11}$ ohmcm range. A low mechanical stress in a range below 360 MPa (compressive stress) is obtained for as-deposited films. The stress can be further reduced to 20 MPa and even shifted into low tensile stress by a post deposition anneal at 600° C.

In this embodiment a SiC region 5 is formed by patterning the 100 nm thick amorphous SiC layer. A photoresist is used as etching mask. Patterning of the SiC film is done by dry etching in an Alcatel reactive ion etcher (RIE) with a power of 60 W and a pressure of 0.05 mbar. The gas flows were 70 sccm $CF_4$, 10 sccm $SF_6$, and 10 sccm $O_2$.

In these conditions an etch rate of 80 nm $min^{-1}$ was measured for SiC with a uniformity of 3%.

After the SiC region 5 is formed, the active device is manufactured (see FIG. 1A). In this embodiment a bipolar transistor is manufactured, but the invention equally works in the manufacturing process of CMOS, BiCMOS, discrete transistors, or any other semiconductor element manufactured with IC technology.

Since the very high silicon resistivity results in excessively wide space-charge regions of the collector-substrate junctions and because of surface channel effects, a special p-well isolation structure for dense integration of the transistors has been developed. A 3-μm deep boron doped p-well with a peak doping concentration of $2\times10^{15}$ $cm^{-3}$ is created by implantation and thermal annealing prior to the formation of the $n^+/n$ collector structure. The thus increased p-type doping level around each transistor leads to narrow collector-substrate space-charge regions and channel stoppers that prevent from parasitic conductive channels at the wafer surface (FIG. 1B).

Subsequent processing steps include an $n^+$ buried layer implant and drive-in, n-doped Si epitaxy, trench etch of the n-epi into the HRS substrate, growth of 30 nm thermal oxide and wet-etch removal on SiC regions.

The performance of the device according to the invention is compared with wafer sections that were not passivated (reference).

In FIG. 1B a dielectric layer 3 of 0.3 μm $SiO_2$ is deposited over the SiC region 5.

The bipolar transistor is further manufactured by implantation of $p^+$ isolation, collector pedestal and plug, emitter-base regions; deposition of surface isolation and contact window patterning; thermal activation of dopants at 950° C.

A second dielectric layer 4 of 0.3 μm $SiO_2$ is deposited over the SiC region 5. Passive elements are formed in the same manufacturing step as the processing of active device interconnect in a 3 μm thick second metallization layer.

Coplanar wave guides (CPW), which are particularly sensitive to surface channel formation, were used for characterization purposes. The electroconductive channel is induced in the semi-insulating region 5.

Figure 2A:
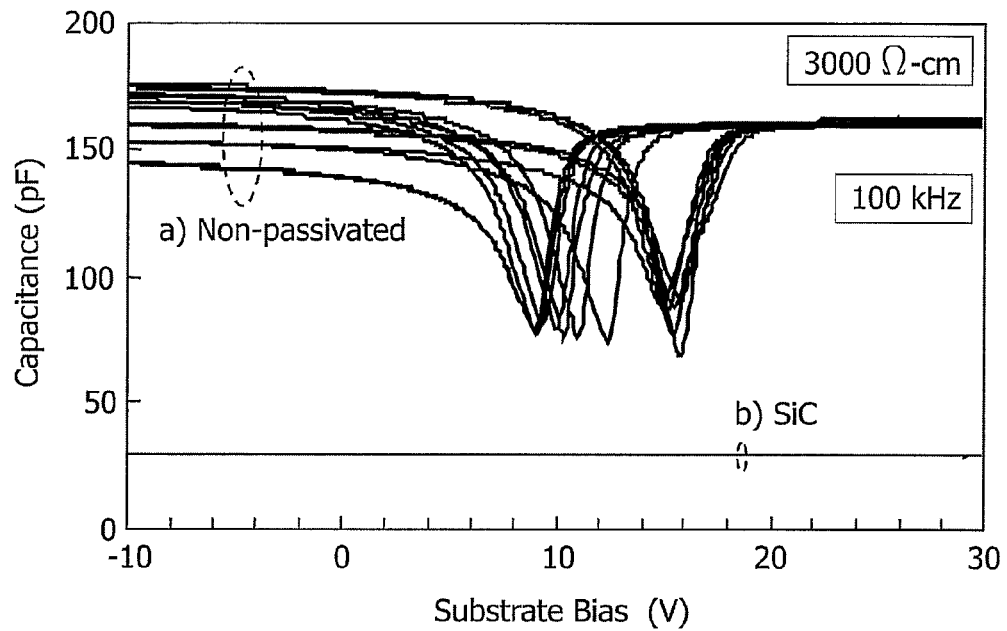

FIG. 2A shows the variation of capacitance-voltage for the 100 nm thick SiC passivation layer according to the invention (a) and (b) for the wafer sections without the SiC passivation layer (reference).

Figure 2B:
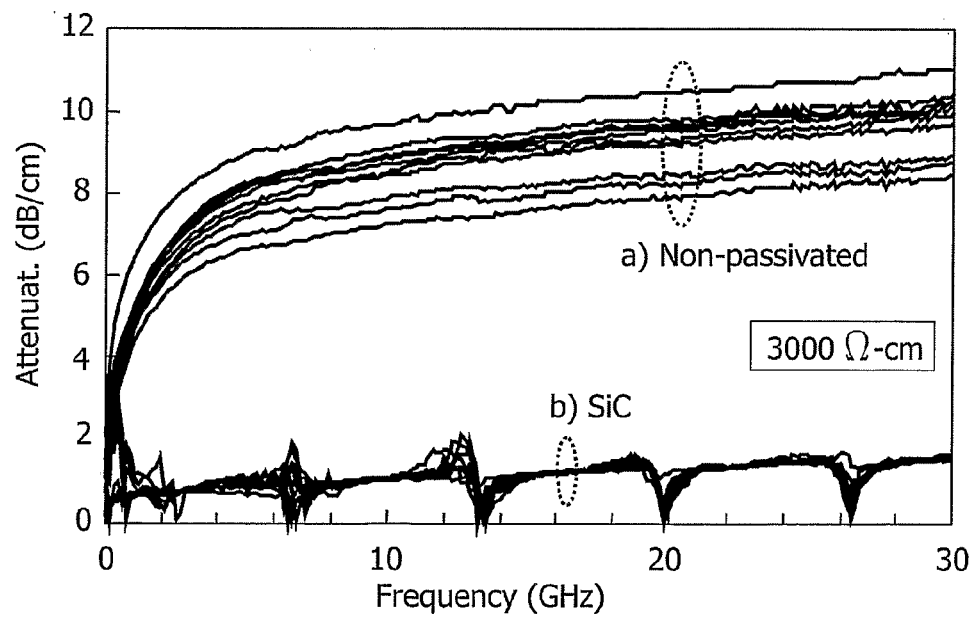

FIG. 2B shows the coplanar wave guide attenuation as a function of frequency for the 100 nm thick SiC passivation layer according to the invention (a) and (b) for the wafer sections without the SiC passivation layer (reference).

The surface passivated CPW provided excellent attenuation Figures of 1-2 dB/cm up to 30 GHz compared to ~8 dB/cm without any passivation. Besides the reduced attenuation for the surface passivated CPW wafer sections the parameter variations in attenuation are significantly reduced compared to the non-passivated wafer sections.

Figure 3:
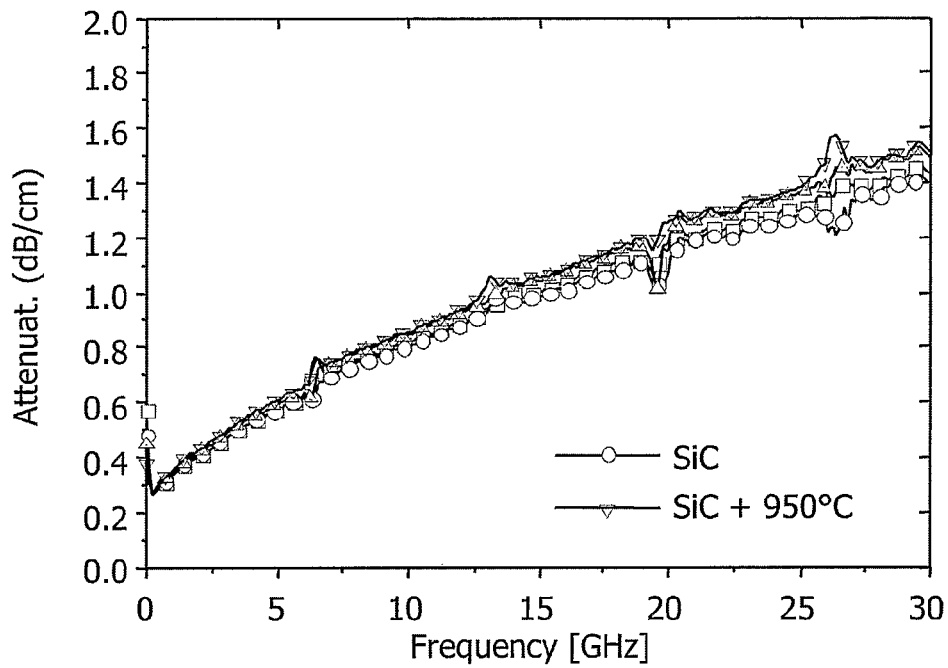
FIG. 3 shows the attenuation of coplanar transmission lines with surface passivation by SiC thin film deposition before bipolar thermal processing and SiC thin film deposition after bipolar thermal processing.

FIG. 3 shows that the SiC thin-film deposition (before and after bipolar thermal processing) both lead to the same attenuation value, and both the CPW attenuation and the associated variation becomes optimum.

Figure 4:
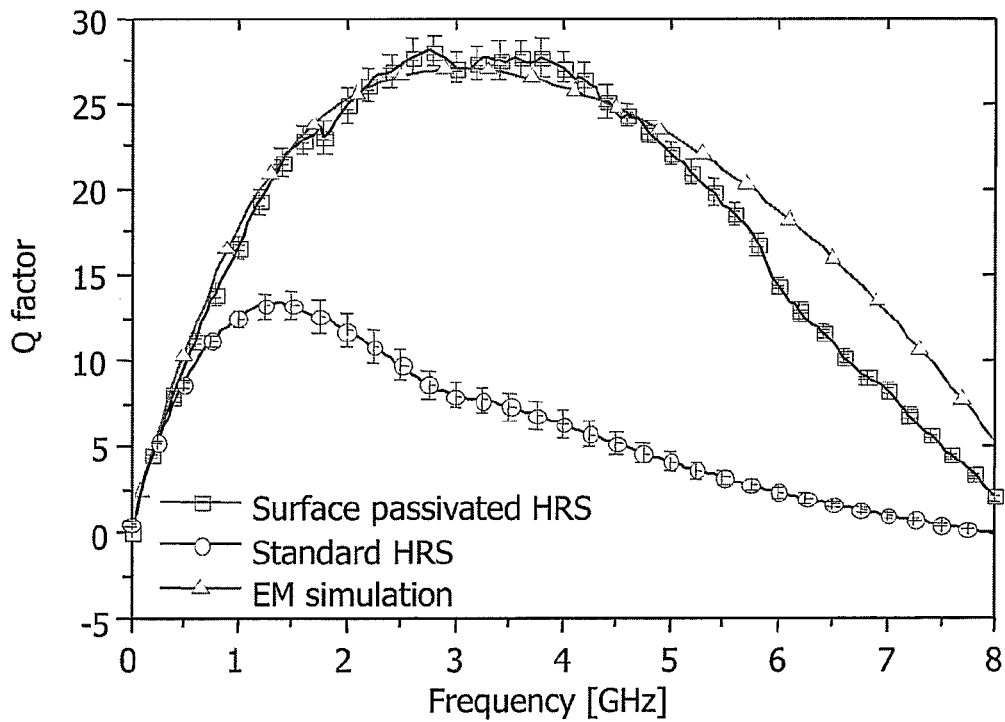
FIG. 4 shows the measured quality factor of an inductor on a high-ohmic semiconductor substrate (HRS), and with a semi-insulating layer passivating the HRS surface according to the invention.

In FIG. 4 the measured quality factors (Q) of a 3.8-nH inductor (R=321 μm, N=2) with and without surface passivation are shown. Also shown are the standard deviations from 20 samples. The measured values are compared with EM simulation by using ADS Momentum with HRS bulk properties as input parameters.

For integrated spiral inductors, Qmax and the variation of Q was improved from Qmax(@1.5 GHz)=13.2±1.15 (reference) to Qmax(@2.85 GHz)=28.1±1.4 for the region 5 with surface passivation. So, optimized surface passivation and design can provide more than 2-times higher inductor-Q and more than 5-times lower Q-variations. Surface passivation not only greatly reduces the effective substrate loss but also lowers the spread of the characteristics of the integrated passive components.

Figure 5:
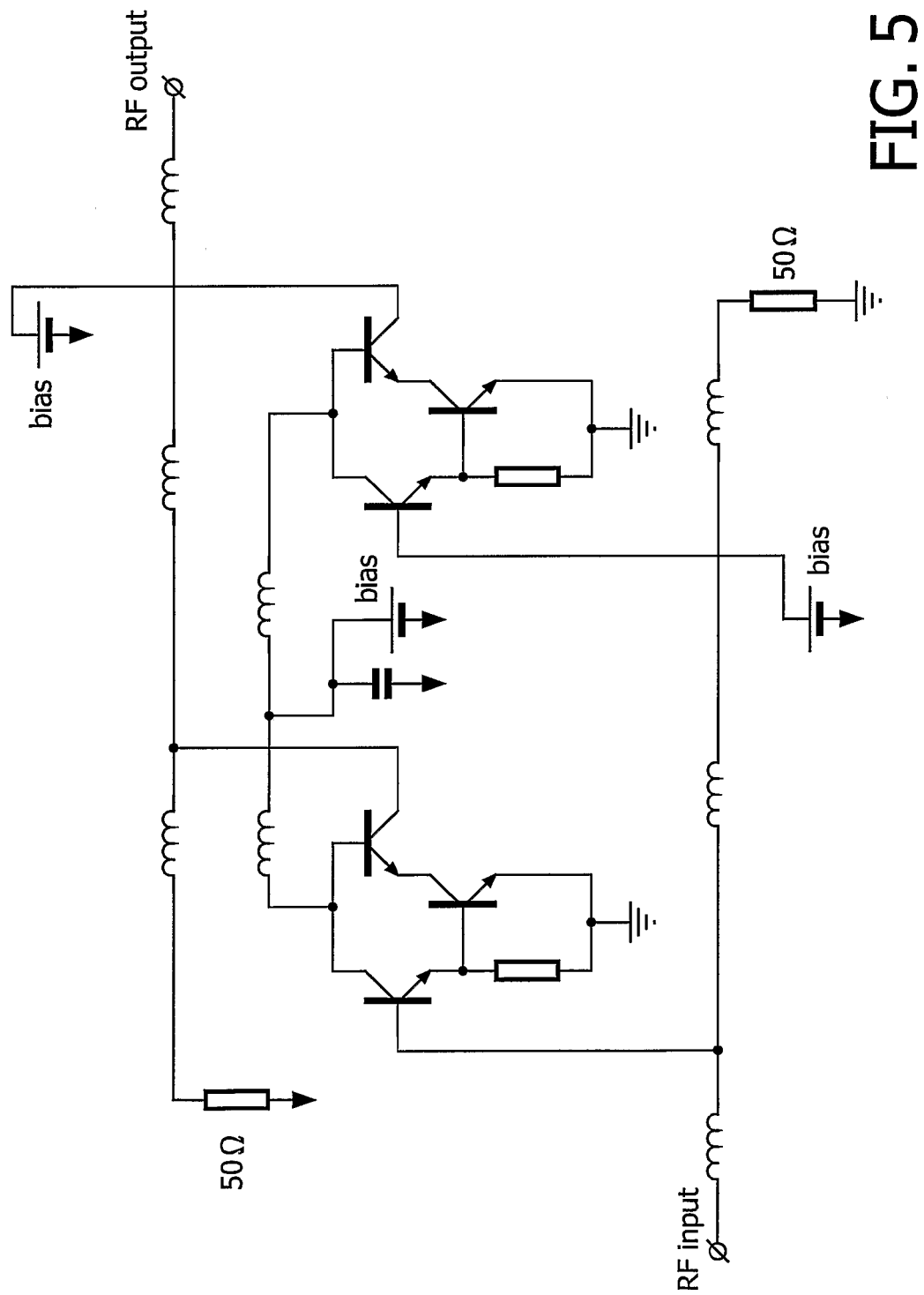
FIG. 5 shows a schematic of a traveling wave amplifier circuit with spiral-inductor delay sections.

FIG. 5 shows a travelling wave amplifier which was used to demonstrate the feasibility of accurate parameter control of active devices and passive components as well as the effect of the high inductor-Q. The circuit was fabricated in the 25-GHz bipolar process as described above. The effect of the change from the standard 2-5 Ohmcm low resistance substrate (LRS) to 2-4 kOhmcm HRS substrates had negligible effect on the bipolar transistor parameters (see Table I).

TABLE I

| BIPOLAR TRANSISTOR PARAMETERS | | |
|---|---|---|
| | HV BJT | HF BJT |
| $A_E$ (μm$^2$) | 20 × 1 | 20 × 1 |
| Beta | 100 | 100 |
| $BV_{CEO}$ (V) | 8.0 | 4.0 |
| $V_A$ (V) | 38 | 12 |
| $C_{EB}$ (fF) | 85 | 88 |
| $C_{BC}$ (fF) | 60 | 90 |
| $C_{Sub}$ (fF) | 200 | 120 |
| $f_T$ @3 V (GHz) | 13 | 25 |

Figure 6:
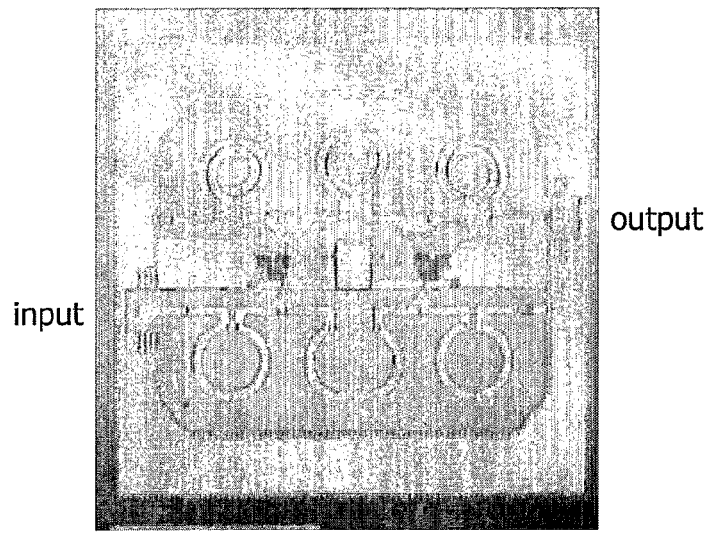
FIG. 6 shows a photograph of the fabricated traveling wave amplifier.

FIG. 6 shows a photograph of the fabricated traveling wave amplifier.

The circuit was designed by using the compact transistor model MEXTRAM and the EM simulator ADS Momentum to lay out the inductors and interconnects.

Figure 7:
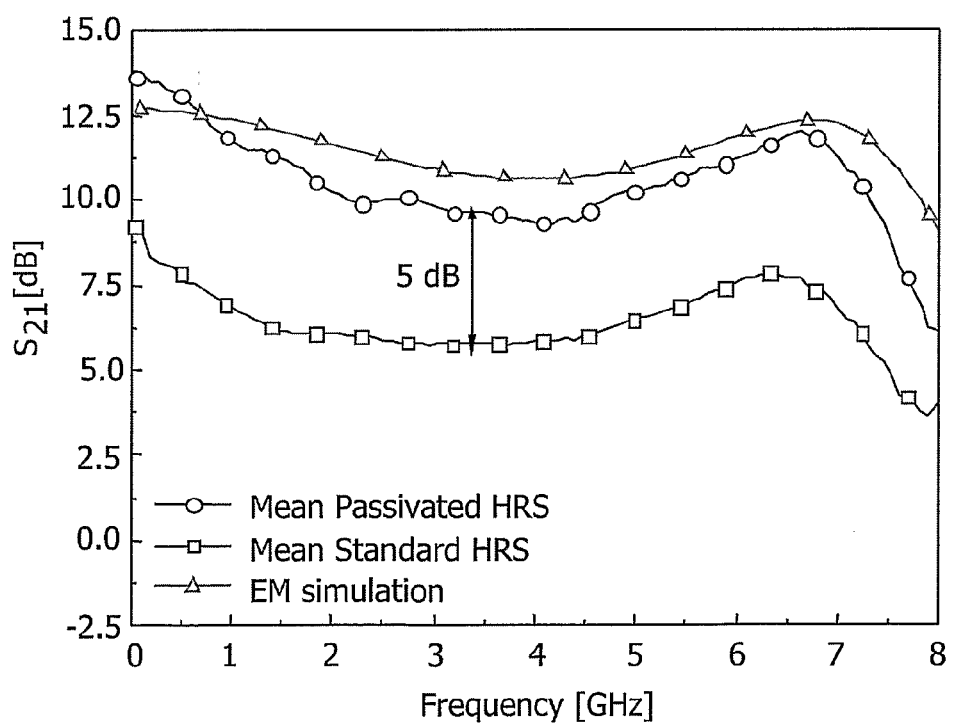
FIG. 7 shows the measured characteristics of the distributed traveling wave amplifier of FIG. 6 on HRS without surface passivation, and HRS with surface passivation according to the invention.

The on-wafer measured characteristics of the travelling wave amplifier showed very good agreement between design and experiment, indicating that a single design cycle approach becomes feasible if one adopts passivated HRS substrates (FIG. 7). Surface-passivated HRS is a true microwave substrate that can accurately be described by its bulk properties so that the transfer from layout simulation to chip integration can be achieved in one single cycle, thus allowing for fast design realization at low cost.

On-wafer measured characteristics of the distributed 7.5-GHz travelling wave amplifier fabricated on HRS with surface passivation according to the invention show an improvement of 5 dB compared to the reference without surface passivation.

Owing to the very high inductor-Q the figure-of-merit of f-3 dB/fr=0.57 was in line with state-of-the-art results in III-V technologies.

FIG. 8 is a diagrammatic, cross-sectional view at right angles to the thickness direction of a second embodiment of the semiconductor device in accordance with the invention. FIGS. 9 through 15 are diagrammatic, cross-sectional views at right angles to the thickness direction of a part referenced II in FIG. 8, in successive stages of the manufacture using an embodiment of a method in accordance with the invention. A semiconductor device 10 (see FIG. 8) comprises a semiconductor body 1 with a semiconductor substrate 2 of silicon having a resistivity ranging, in this case, between 5 and 10 kΩcm. The surface of the device 10 is covered with an insulating dielectric layer 4 of silicon dioxide. The surface is provided with, in this case three, recesses 6, 66, here in the form of grooves 66 and a trough 6. The recesses are filled with a further insulating dielectric layer 4 which, in this case, comprises a silicon dioxide produced using a HDP (=High Density Plasma). The walls of the recesses 6, 66 are provided with spacers 11, in this case of silicon dioxide. A thin semi-insulating layer 15, in this case comprising SIPOS, is situated between the spacers 11 and the dielectric layer 4 filling the recess 6, 66.

A part 5, 55 of the semi-insulating SIPOS layer bordering on the bottom of the recesses 6, 66 has, on the one hand, a conductivity which is high enough to enable an inversion or accumulation channel formed during operation to be incorporated therein and, on the other hand, said part is sufficiently high-ohmic to ensure that a reduction of the effective resistance of the semiconductor substrate 2 due to the formation of the inversion or accumulation channel does not take place. The parts 15A of the SIPOS layer 15 which border on the surface of the semiconductor body 1 are converted by (complete) thermal oxidation into an electrically insulating/dielectric material.

The device 10 of this example comprises two sub-regions A, B which are situated, respectively, to the left and to the right of the line I-I. The left-hand part A comprises, between the two recesses 6, a semiconductor region 7 in which a number of semiconductor elements 8 are integrated, only one of which is shown in the FIG. 8. The parts 55 of the SIPOS layer 15 situated at the bottom of the recesses 66 serve as a channel stopper for the semiconductor region 7 and the semiconductor elements 8 present therein. The right-hand part B of the device 10 comprises passive elements 20, including conductor tracks 20. By virtue of the presence of the part 5 of the SIPOS layer 15, which part is situated at the bottom of the recess 6, it is precluded that the effective resistance of the semiconductor substrate 2 is not or substantially not reduced at said location, so that the high-frequency losses in said part are very limited. The device 10 of this example is manufactured in the following manner using a method in accordance with the invention.

The starting substrate (see FIG. 9) is a high-ohmic semiconductor substrate 2, in this case of silicon, on which a dielectric layer 3 of silicon dioxide ($SiO_2$) is provided by means of thermal oxidation. On said layer, a further dielectric layer 13 is provided, in this case of silicon nitride ($SiO_2$), by means of, in this case, CVD (=Chemical Vapor Deposition). Subsequently, a mask M is provided on said dielectric layer by applying a photoresist layer which is patterned by means of photolithography.

Next (see FIG. 10), the parts of the dielectric layers 3, 13 situated outside the mask are removed by means of etching, using, for example, phosphoric acid ($H_3PO_4$) and an aqueous solution of hydrogen fluoride (HF).

Figure 11:
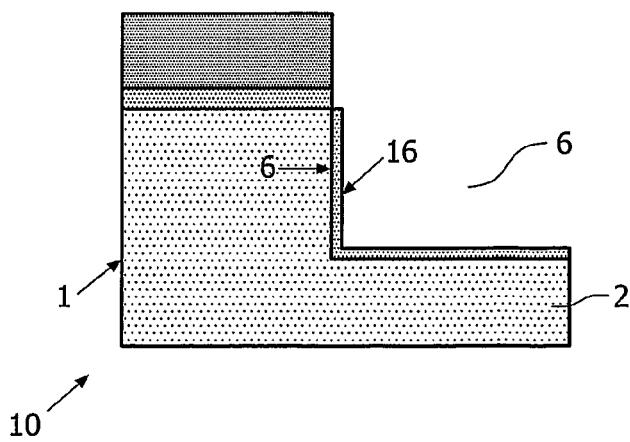
Figure 12:
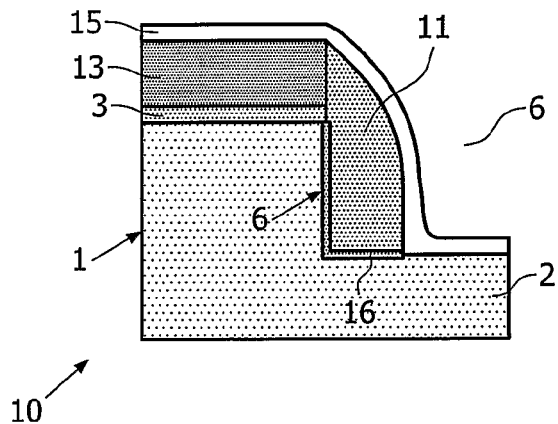
Figure 13:
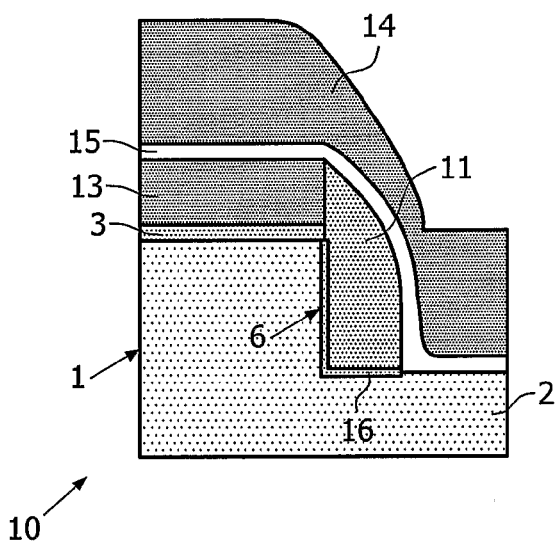
Figure 14:
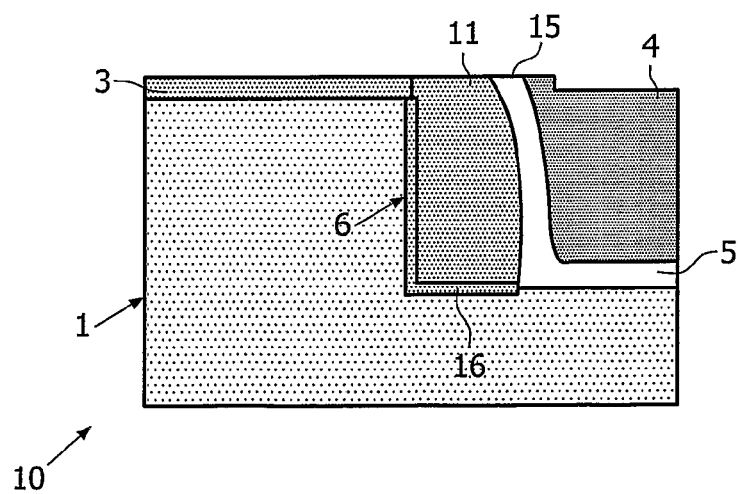
Figure 15:
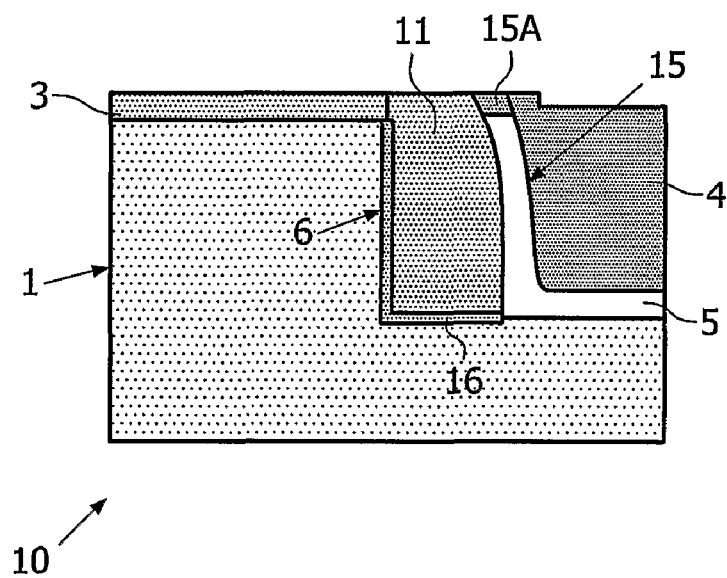

Subsequently (see FIG. 11), after removal of the photoresist mask M, recesses 6, 66 are formed in the semiconductor substrate 2 by means of a dry-etch process. In a favorable modification, also the dielectric layers 3, 13 are removed by means of a dry-etch process. In this case, taking the stage shown in FIG. 9 as the starting point, the stage shown in FIG. 11 is reached in a single process step. It is noted again that FIGS. 9 through 15 only show a part of the recess 6 and the adjoining part of the substrate 2. Next, a thin oxide layer 16 is formed on the walls and the bottom of the recess(es) 6 by means of a slight thermal oxidation. This layer properly bounds electrically active semiconductor regions which may border on the recess 6.

Subsequently (see FIG. 12), a spacer 11 of silicon dioxide is formed so as to be positioned against the wall(s) of the recess 6. This is achieved by first depositing a uniform dielectric layer 11 over the entire surface of the semiconductor body 2, for example by means of CVD, after which the parts of said layer 11 extending parallel to the surface are removed again by means of anisotropic dry (plasma) etching, so that the spacers 11 remain.

In a favorable modification, the spacer 11 is formed from the thin oxide layer 16 by removing the part thereof that is situated at the bottom of the recess 6 by means of anisotropic etching. In this case, deposition of the dielectric layer 11 shown in the Figures can be omitted. This is particularly advantageous if the lateral dimensions of the recess 6 are very small and if similar recesses 66 are formed in part A of the device 10. As a matter of fact, in part A, said small dimensions are very important for the application of advanced IC processes. A further advantage of such a spacer 11 formed from the thin oxide layer 16 resides in that it is less vulnerable to unintentional slight etching from above at a later stage in the process. As a result, the flatness/the staying flat of the device 10 is improved.

Next, a SIPOS layer 15 is deposited on the surface by means of CVD.

Subsequently (see FIG. 13), a dielectric layer 14 is deposited which completely fills the recess 6.

Next (see FIG. 14), the parts of the dielectric layers 14, 13 and of the SIPOS layer 15 which are situated outside the recess 6 are removed by means of a CMP (=Chemical Mechanical Polishing) process. In this process, the device 10 is planarized.

Subsequently (see FIG. 15), a part 15A of the SIPOS layer 15 bordering on the surface is converted, by means of a thermal oxidation process, into an electrically insulating dielectric material. The situation at the surface of the device 10, as shown in FIG. 8, is thus achieved. The semiconductor region 7 may be formed by means of ion implantation, for example, in the left-hand part A of the device 10. Semiconductor elements 8 are formed therein, in a customary manner, using IC (=Integrated Circuit) technology.

Next, in the right-hand part B of the device, passive elements 20, including in any case conductor tracks 20, are formed on the—electrically insulated—surface of the device 10. The passive elements may further also comprise resistors, capacitors or coils. In this region B, also discrete semiconductor elements may be mounted on the surface. Connection regions present in the region B, which take the form of so-termed bond pads, may provide the device, by means of wire connections, with external electric connections to, for example, the conductors of a conductor frame.

FIG. 16 schematically shows a co-planar waveguide. The (HRS) substrate is made from Float Zone Silicon having a high resistivity of 5 kOhm-cm. A 12 nm thick semi-insulating layer of SiO (further indicated as SICS) is deposited in a low-pressure chemical vapor deposition (L-P-CVD) process. After the deposition of a 200 nm thick TEOS layer, the wafer is annealed in an inert gas at a temperature between 900 and 1100° C. for variable periods of time. Next, a layered structure of 50 nm nitride and 500 nm oxide is provided, after which a 2 μm thick copper layer is provided which is subsequently planarized using CMP in a single Damascene process. The copper in the Damascene structure has a thickness of 2 μm. The overall length of the co-planar waveguide is 1 mm. The width of a copper track is 30 μm, and the spacing between the copper tracks is 6.5 μm.

For comparison, the same co-planar waveguide has also been manufactured on a Si substrate having a resistivity of 7 Ohm-cm and on a substrate of glass.

FIG. 17 shows the losses of the co-planar waveguide on the above-mentioned three different substrates: the standard Si substrate having a resistivity of 7 Ohm-cm, the substrate of glass and the high-ohmic substrate having a resistivity of 5 kOhm-cm, with and without the semi-insulating layer (SICS) according to the invention. The high-ohmic Si substrate which is provided with the semi-insulating layer has very low substrate losses, which are close to those of the glass substrate. The losses in the high-ohmic substrate provided with the SICS are a factor of two lower than the losses on a standard Si substrate for the measured frequencies up to 100 GHz.

FIG. 18 shows the parallel conductance of a signal to ground, which runs through the dielectric layers and the substrate. The data is obtained from S-parameter measurements. If parallel conduction is small, there is hardly any signal loss in the substrate. The mobility of charges in the semi-insulating layer is at least three orders of magnitude lower than the mobility in the high-ohmic semiconductor substrate. The density of traps is about $10^{12}$ at/cm$^2$ in the semi-insulating layer. FIG. 18 thus shows that the substrate losses in the high-ohmic substrate provided with the SICS are, respectively, 100 and 10 times smaller than those in a standard Si substrate and in a high-ohmic substrate without the SICS.

In FIG. 19, the parallel conductance is extracted from the measured data of different samples that have been subjected to a temperature treatment.

The SICS layer retains its properties during a 30-minute thermal oxidation treatment at 900° C., or after a rapid temperature anneal (RTA) at 1100° C. After 30 minutes at 1100° C., the layer reaches its thermal limit, and the parallel conductance becomes equal to that on standard low-ohmic Si. These experiments show that the overall thermal budget can be chosen so as to be high enough to apply the SICS layer in current CMOS processes.

In another embodiment, the semi-insulating layer is applied in a standard CMOS process. FIG. 20 shows a method of integrating the semi-insulating layer in a shallow trench isolation (STI)-structure.

As an alternative to the method described with reference to FIGS. 9-15, in this embodiment the oxide at the bottom of the trench is removed in an etch step (FIG. 20-(2)). Only two additional steps are applied: anisotropic etching of the entire wafer (without a mask) and deposition of the semi-insulating layer. In this embodiment, the semi-insulating layer is a SIPOS layer which is deposited in a LP-CVD process. The introduction of the semi-insulating layer does not require adaptation of the deposition of the oxide layer in the trench (in this embodiment the oxide layer is a high-density plasma oxide (HDP oxide)) and of the CMP process.

Subsequently, in FIG. 20-(6) a test structure is produced to test the channel-stopper action of the semi-insulating layer in the STI. Highly doped p regions are provided on both sides of the trench. By means of a metal gate, which on either side of the trench demonstrates an overlap with the active region, the resistance of the channel $R_{ch}$ can be measured in the high-ohmic n-type substrate. The metal gate has a width of 3000 μm and a length of 1 μm.

FIG. 21 shows how the semi-insulating layer in the STI operates as a channel stopper. The resistance of the channel $R_{ch}$ is measured as a function of the gate voltage $V_{gate}$ over a range of −80 to +80 V. At each gate voltage a current is injected into the source of the transistor. A 4-point measuring technique is used to determine the channel resistance. In the case of high-ohmic substrates without the semi-insulating channel stopper (HRS no SICS) the channel-stopper resistance exhibits substantial variation (swing) around the threshold voltage. As a result, a small variation in the fixed charge in the oxide or a variation in the very low doping level of the substrate ($10^{12}$-$10^{24}$ at/cm³) can easily lead to a substantial change in the conductivity of the channel. The semi-insulating layer in the STI limits the change in the channel resistance $R_{ch}$ and hence improves the control over the spread in substrate losses over the wafer.

FIG. 22 shows the average value of the channel resistance $R_{ch}$ and the spread over 42 dies per wafer. The semi-insulating channel stopper improves the reproducibility and hence enlarges the process window for the use of high-ohmic substrates (HRS) as loss-free substrates.

FIG. 23 schematically shows a few parameters which can be influenced in a CMOS environment by the semi-insulating layer in the STI structure. The parameters that could be influenced by the semi-insulating layer are: (1) the N⁺/Pwell diode current, (2) the P-well resistance, (3) N-well/P-well diode current, and (4) the P⁺/Nwell diode current.

FIG. 24 shows a comparison between the diode currents illustrated in FIG. 23 for high-ohmic substrates a) without the invention (fall line) and b) with the semi-insulating channel stopper in accordance with the invention (broken line). Apart from a small increase of the generation-recombination current in the N⁺/p-well diode, the SICS layer does not, influence the behavior of the active devices.

FIG. 25 shows the p-well resistance, which is measured between two 30 μm-wide P⁺⁺ finger patrons. The width of the p-well is bounded by 2 strip-shaped N-well patterns. The resistance values of the channel $R_{ch}$ are substantially identical in a) reference without the invention (broken line with squares) and in b) with the semi-insulating layer according to the invention (full line with triangles).

The invention is not limited to the examples of embodiments described herein, and within the scope of the invention many variations and modifications are possible to those skilled in the art. For example, devices having a different geometry and/or different dimensions may be manufactured. It is expressly noted that also exclusively passive devices are possible, or devices with discrete semiconductor elements mounted on the surface.

It is noted that also materials other than those mentioned in the examples may be used within the scope of the invention. It is also possible to employ other deposition techniques for the above-mentioned or other materials, such as epitaxy, CVD (=Chemical Vapor Deposition), sputtering and vapor deposition. Instead of wet-chemical etch methods, use can be made of "dry" techniques, such as plasma etching, and conversely.

The invention claimed is:

1. A semiconductor device comprising a high-ohmic semiconductor substrate which is covered with a dielectric layer which contains charges, on which dielectric layer one or more passive electronic elements including conductor tracks are situated, wherein, at the location of the passive elements a region is situated at the interface between the semiconductor substrate and the dielectric layers, causing the electrical conductivity of an electroconductive channel induced in the semiconductor device by the charges to be decreased at the location of the region characterized in that the region is formed by deposition and comprises a semi-insulating material.

2. A semiconductor device as claimed in claim 1, characterized in that the semi-insulating material of the deposited region comprises a mixture of silicon and oxygen.

3. A semiconductor device as claimed in claim 1, characterized in that the resistivity of the semi-insulating material ranges between 10 kΩcm and 30 GΩ.cm, and preferably between 1 MΩcm and 1 GΩ.cm.

4. A semiconductor device as claimed in claim 1, characterized in that the semi-insulating material is a Sic compound.

5. A semiconductor device as claimed in claim 4, characterized in that the stress in an as-deposited layer of the SiC compound material is below 360 MPa.

6. A semiconductor device as claimed in claim 1, characterized in that the region is situated at the bottom of a recess formed in the semiconductor substrate.

7. A semiconductor device as claimed in claim 1 characterized in that the region comprises a number of mutually separated strip-shaped sub-regions.

8. A method of manufacturing a semiconductor device
wherein a dielectric layer comprising charges is formed on a high-ohmic semiconductor substrate and one or more passive electronic elements including conductor tracks are provided, on said dielectric layer, and
wherein, at the location of the passive elements a region is formed at the interface between the semiconductor substrate and the dielectric layer as a result of which the electrical conductivity of an electroconductive channel induced in the semiconductor device by the charges is reduced at the location of the region
characterized in that the region is formed by means of deposition, and a semi-insulating material is selected as the material for the region.

9. A method as claimed in claim 8, characterized in that a mixture of silicon and oxygen is chosen as the semi-insulating material.

10. A method as claimed in claim 8 characterized in that the resistivity of the semi-insulating material is chosen in ranges between 10 kΩcm and 30 GΩcm, and preferably between 1 MΩcm and 1 GΩcm.

11. A method as claimed in claim 8, characterized in that the semiinsulating layer is deposited prior to a manufacturing process of an active semiconductor element in the substrate.

12. A method as claimed in claim 8, characterized in that the semiinsulating material of the layer comprises silicon and carbon.

13. A method as claimed in claim 12, characterised in that the SiC layer is amorphous.

14. A method of manufacturing a semiconductor device
wherein a dielectric layer comprising charges is formed on a high-ohmic semiconductor substrate and one or more passive electronic elements including conductor tracks are provided, on said dielectric layer, and
wherein, at the location of the passive elements a region is formed at the interface between the semiconductor substrate and the dielectric layer as a result of which the electrical conductivity of an electroconductive channel induced in the semiconductor device by the charges is reduced at the location of the region
characterized in that the region is formed by means of deposition, and a semi-insulating material is selected as the material for the region, wherein the semiconductor substrate a recess is formed a side wall of which is covered with an insulating spacer after which a thin semi-insulating layer is deposited on the surface of the device as well as a dielectric layer by means of which the recess is filled completely, after which the device is planarized by chemical-mechanical polishing, in which process the parts of semi-insulating layer and dielectric layer that are situated outside the recess are removed.

15. A method as claimed in claim 14, characterized in that the insulating spacer is formed by subjecting the walls and the bottom of the recess to a thermal oxidation treatment, after which the thermal oxide formed at the bottom of the recess is removed again by means of anisotropic etching.

16. A method as claimed in claim 14, characterized in that a part of the semi-insulating layer bordering on the surface of the device is converted into a dielectric region by oxidation.

* * * * *